US012650469B2

(12) United States Patent
Zhang et al.

(10) Patent No.: US 12,650,469 B2
(45) Date of Patent: Jun. 9, 2026

(54) EFFECTIVE CAPACITY ESTIMATION METHOD AND SYSTEM FOR SUPERCAPACITOR ENERGY STORAGE SYSTEMS

(71) Applicant: Beijing Jiaotong University, Beijing (CN)

(72) Inventors: Hailiang Zhang, Beijing (CN); Haocheng Guo, Beijing (CN); Zhongping Yang, Beijing (CN); Fei Lin, Beijing (CN); Zhihong Zhong, Beijing (CN); Jiayu Mi, Beijing (CN); Hu Sun, Beijing (CN); Xiaochun Fang, Beijing (CN)

( * ) Notice: Subject to any disclaimer, the term of this patent is extended or adjusted under 35 U.S.C. 154(b) by 357 days.

(21) Appl. No.: 18/239,187

(22) Filed: Aug. 29, 2023

(65) Prior Publication Data

US 2024/0069104 A1 Feb. 29, 2024

(30) Foreign Application Priority Data

Aug. 31, 2022 (CN) .......................... 202211053360.9

(51) Int. Cl.
G01R 31/367 (2019.01)
G01R 31/388 (2019.01)
G01R 31/396 (2019.01)

(52) U.S. Cl.
CPC ......... *G01R 31/367* (2019.01); *G01R 31/388* (2019.01); *G01R 31/396* (2019.01)

(58) Field of Classification Search
CPC ... G01R 31/367; G01R 31/388; G01R 31/396
See application file for complete search history.

(56) References Cited

U.S. PATENT DOCUMENTS

2017/0113565 A1* 4/2017 Lin .......................... B60L 58/16

FOREIGN PATENT DOCUMENTS

| CN | 110728103 A | * | 1/2020 | |
| CN | 113884904 A | * | 1/2022 | ........... G01R 31/382 |

OTHER PUBLICATIONS

Devillers et al., "Review of characterization methods for supercapacitor modelling" Journal of Power Sources 246 (2014) 596-608 (Year: 2014).*

(Continued)

*Primary Examiner* — John C Kuan

(57) ABSTRACT

An effective capacity estimation method and system for super capacitor energy storage systems are provided. The method includes: establishing a nonlinear electrical model of supercapacitor cell and an equivalent electrical model of a supercapacitor system; obtaining the first test data by charging the supercapacitor cell; based on the first test data, setting the initial value of parameters of the nonlinear electrical model of the supercapacitor cell by a preset algorithm; using a least-square method to identify the parameters of the nonlinear electrical model of the supercapacitor cell; obtaining electrical parameters of the equivalent electrical model of the supercapacitor system except the connection resistance parameters, carrying out a charging test of the supercapacitor system to obtain the connection resistance parameters, and estimating an effective capacity of the supercapacitor energy storage system based on the equivalent electrical model of the supercapacitor system after parameter identification.

20 Claims, 7 Drawing Sheets

(56)                  References Cited

OTHER PUBLICATIONS

Enhui et al., "Research on combination of series and parallel with Supercapacitor Module" IEEE 2010 (Year: 2010).*
Lee et al., "Prediction of Equivalent-Circuit Parameters for Double-Layer Capacitors Module" IEEE 2013 (Year: 2013).*
Zhang et al., "A review of supercapacitor modeling, estimation, and applications: A control/management perspective" Renewable and Sustainable Energy Reviews 81 (2018) 1868-1878 (Year: 2018).*
Zhao et al., "A Parameters Identification Method of the Equivalent Circuit Model of the Supercapacitor Cell Module Based on Segmentation Optimization" IEEE Access 2020 (Year: 2020).*

* cited by examiner

S1

Establishing a nonlinear electrical model of a supercapacitor cell and an equivalent electrical model of a supercapacitor system

S2

Obtaining the first test data by charging the supercapacitor cell

S3

Based on the first test data, setting the initial value of parameters of the nonlinear electrical model of the supercapacitor cell by a preset algorithm

S4

Using a least-square method to identify the parameters of the nonlinear electrical model of the supercapacitor cell, and obtaining the nonlinear electrical model with accurate parameters

S5

Obtaining electrical parameters of the equivalent electrical model of the supercapacitor system except for the connection resistance parameters, carrying out a charging test of the supercapacitor system to obtain the connection resistance parameters, and estimating an effective capacity of the supercapacitor energy storage system based on the equivalent electrical model of the supercapacitor system after parameter identification

FIG. 5

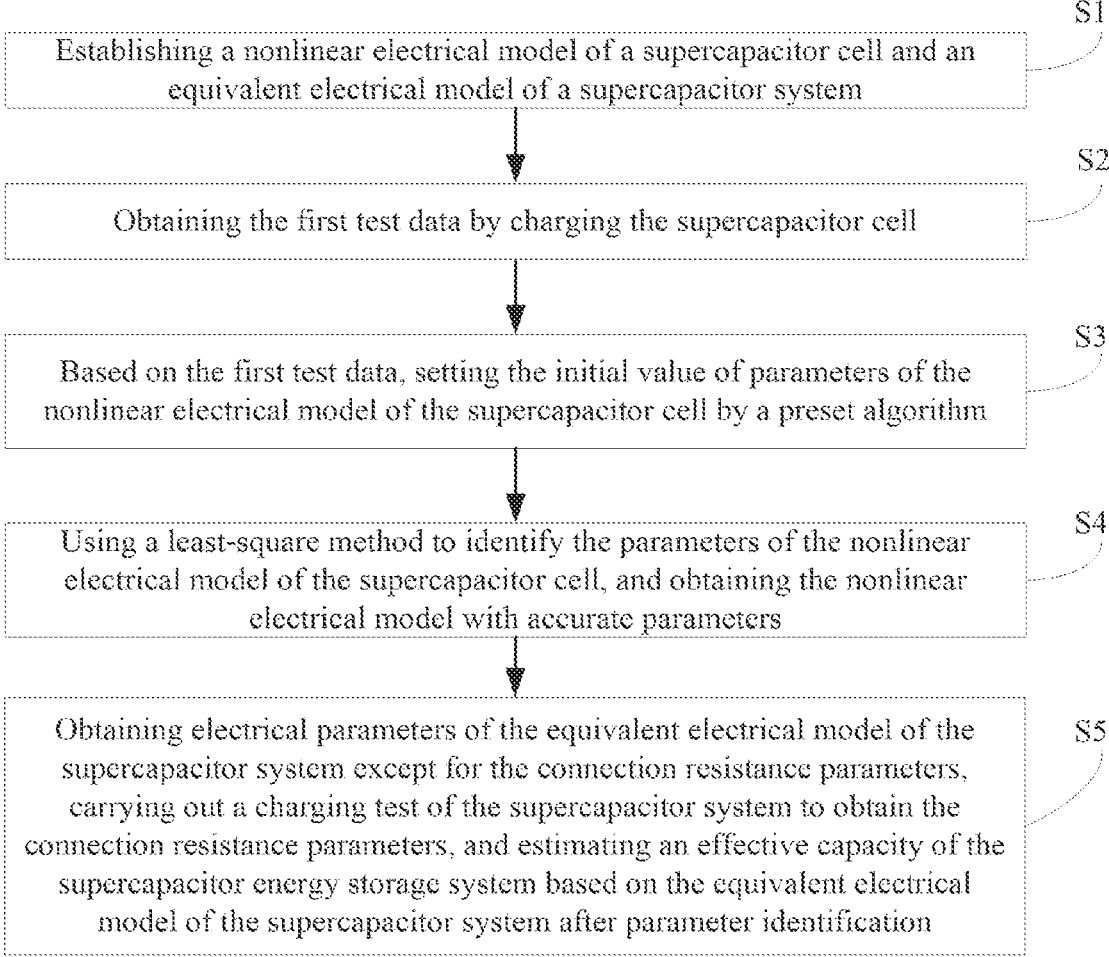

FIG. 6

EFFECTIVE CAPACITY ESTIMATION METHOD AND SYSTEM FOR SUPERCAPACITOR ENERGY STORAGE SYSTEMS

CROSS REFERENCE TO THE RELATED APPLICATIONS

This application is based upon and claims priority to Chinese Patent Application No. 202211053360.9, filed on Aug. 31, 2022, the entire contents of which are incorporated herein by reference.

TECHNICAL FIELD

The invention relates to the field of supercapacitor energy storage, in particular to an effective capacity estimation method and system for supercapacitor energy storage systems.

BACKGROUND

The supercapacitor energy storage system has become a hot spot to solve the problem of braking energy recovery of urban rail trains. The available capacity of the super system restricts the energy saving of the supercapacitor energy storage system. At present, the available power of supercapacitors is estimated by the equivalent circuit of resistance and capacitance in series, which is estimated by the capacity calculation formula, ignoring the capacitance change of supercapacitors in the full voltage range and the nonlinear characteristics of capacitance and voltage of supercapacitors. This simple effective capacity estimation will greatly reduce the energy saving of the supercapacitor energy storage system, increasing the cost of equipment per unit of electricity saving.

SUMMARY

Therefore, the technical problem to be solved by the invention is to overcome the defect that the effective capacity estimation in the existing technology is too simple, increasing the cost of equipment per unit of electricity saving, thus providing an effective capacity estimation method and system for supercapacitor energy storage systems.

In the first aspect, the embodiment of the invention provides an effective capacity estimation method for supercapacitor energy storage systems, including:

establishing a nonlinear electrical model of a supercapacitor cell and an equivalent electrical model of a supercapacitor system;

obtaining the first test data by charging the supercapacitor cell;

based on the first test data, setting the initial value of parameters of the nonlinear electrical model of the supercapacitor cell by a preset algorithm;

using a least-square method to identify the parameters of the nonlinear electrical model of the supercapacitor cell, and obtaining the nonlinear electrical model with accurate parameters;

obtaining electrical parameters of the equivalent electrical model of the supercapacitor system except for the connection resistance parameters, carrying out a charging test of the supercapacitor system to obtain the connection resistance parameters, and estimating an effective capacity of the supercapacitor energy storage system based on the equivalent electrical model of the supercapacitor system after parameter identification.

Optionally, the nonlinear electrical model of the supercapacitor cell is a two-branch electrical model, the nonlinear electrical model of the supercapacitor cell, including a connection resistance, the first branch and the second branch, wherein, the first branch is connected in parallel with the second branch and connected in series with the connection resistance;

the first branch includes the first resistor, the first capacitor, and a voltage-controlled capacitor, the first capacitor is connected in series with the first resistor after being connected in parallel with the voltage-controlled capacitor;

the second branch includes the second resistor and the second capacitor, and the second resistor is connected in series with the second capacitor.

Optionally, based on the first test data, setting the initial value of parameters of the nonlinear electrical model of the supercapacitor cell by a preset algorithm, including:

constant current charging of supercapacitor cell;

when the charging time reaches the first preset time, measuring the voltage at both ends of the supercapacitor cell as the first voltage;

calculating the initial value of the first resistance parameter according to the first voltage and constant current charging current;

when the supercapacitor cell is monitored to be charged to the second voltage, recording the constant current charging time of the supercapacitor cell as the second preset time;

according to the first preset time, the second preset time, the first voltage, the second voltage, and the constant current charging current, calculating the initial parameters of the first capacitor.

Optionally, based on the first test data, setting the initial value of parameters of the nonlinear electrical model of the supercapacitor cell by a preset algorithm, which also includes:

when the supercapacitor cell is charged to the rated voltage, completing the charging, and recording the constant current charging time of the supercapacitor cell as the third preset time;

after completing the charging, entering a charge redistribution stage of the two branches, when the supercapacitor cell is monitored to discharge to the fourth voltage, recording the discharge time as the fourth preset time;

according to the fourth preset time and the first preset time, recording the actual constant current charging time of the supercapacitor cell;

according to the actual constant current charging time and constant current charging current of the supercapacitor cell, calculating the first charge amount actually stored in the supercapacitor cell;

according to the first branch transient capacitance integral formula, calculating the second charge amount when the two ends of the supercapacitor cell are charged to the fourth voltage;

according to the first charge calculation formula and the second charge calculation formula, calculating the coefficient of the voltage-controlled capacitor.

Optionally, based on the first test data, setting the initial value of parameters of the nonlinear electrical model of the supercapacitor cell by a preset algorithm, which also includes:

when the supercapacitor cell is monitored to discharge to the fifth voltage, recording the discharge time as the fifth preset time;

according to the fourth preset time, the fifth preset time, the first capacitor, the coefficient of the voltage-controlled capacitor, and the preset voltage value of the voltage-controlled capacitor, establishing an equation of the charging current of the first branch to the second branch from the perspective of the resistance voltage drop and the charge redistribution, and calculating the initial value of the parameters of the second resistor;

when the discharge time is monitored to reach the sixth preset time, measuring the voltage at both ends of the supercapacitor cell as the sixth voltage, and calculating the charge amount at the sixth preset time and the initial value of the second capacitor, the time interval between the sixth preset time and the fifth preset time is the time interval between the completion of the traction work and the start of the braking work of the urban rail transit vehicle.

Optionally, obtaining electrical parameters of the equivalent electrical model of the supercapacitor system except for the connection resistance parameters, carrying out a charging test of the supercapacitor system to obtain the connection resistance parameters, and estimating an effective capacity of the supercapacitor energy storage system based on the equivalent electrical model of the supercapacitor system after parameter identification, including:

establishing a corresponding relationship between the nonlinear electrical model of the supercapacitor cell and the equivalent electrical model of the supercapacitor system, based on the parameter identification results of the nonlinear electrical model of the supercapacitor cell, obtaining other electrical parameters of the equivalent electrical model of the supercapacitor system except the connection resistance parameters;

charging the supercapacitor system to obtain the second test data;

calculating the parameter identification value of the connection resistance according to the second test data;

obtaining the identification parameters of the equivalent electrical model of the supercapacitor system according to the other electrical parameters of the equivalent electrical model of the supercapacitor system except for the connection resistance parameters and the identification parameters of the connection resistance.

Obtaining a working voltage range of the supercapacitor system, and estimating the effective capacity of the supercapacitor energy storage system according to the estimation formula of available power.

Optionally, deriving the equivalent electrical model of the supercapacitor system with n serial-cells and m parallel-strings based on the nonlinear electrical model of the supercapacitor cell.

In the second aspect, the embodiment of the invention provides an effective capacity estimation system for supercapacitor energy storage systems, including:

a construction module, which is used to establish the nonlinear electrical model of the supercapacitor cell and the equivalent electrical model of the supercapacitor system;

an acquisition module, which is used to charge the supercapacitor cell to obtain the first test data;

a setting module, which is used to set the initial value of the parameters of the nonlinear electrical model of the supercapacitor cell through the preset algorithm based on the first test data;

an identification module, which is used to identify the parameters of the nonlinear electrical model of the supercapacitor cell by using the least-square method to obtain the nonlinear electrical model with accurate parameters;

an estimation module, which is used to obtain other electrical parameters of the equivalent electrical model of the supercapacitor system except for the connection resistance parameters, carries out the charging test of the supercapacitor system to obtain the connection resistance parameters, and estimating an effective capacity of the supercapacitor energy storage system based on the equivalent electrical model of the supercapacitor system after parameter identification.

In the third aspect, the embodiment of the invention provides a computer-readable storage medium, the computer-readable storage medium stores computer instructions, which are used to enable the computer to perform the effective capacity estimation method for supercapacitor energy storage systems described in the first aspect of the embodiment of the invention.

In the fourth aspect, the embodiment of the invention provides a computer device, including a memory and a processor, the memory and the processor communicate and connect, the memory stores computer instructions, and the processor executes the computer instructions to perform the effective capacity estimation method for supercapacitor energy storage systems described in the first aspect of the embodiment of the invention.

The technical solution of the invention has the following advantages:

The invention provides an effective capacity estimation method for supercapacitor energy storage systems, including: establishing a nonlinear electrical model of supercapacitor cell and an equivalent electrical model of supercapacitor system; obtaining the first test data by charging the supercapacitor cell; based on the first test data, setting the initial value of parameters of the nonlinear electrical model of the supercapacitor cell by a preset algorithm; using the least-square method to identify the parameters of the nonlinear electrical model of the supercapacitor cell, and obtaining the nonlinear electrical model with accurate parameters; obtaining electrical parameters of the equivalent electrical model of the supercapacitor system except the connection resistance parameters, carrying out a charging test of the supercapacitor system to obtain the connection resistance parameters, and estimating an effective capacity of the supercapacitor energy storage system based on the equivalent electrical model of the supercapacitor system after parameter identification. The initial value setting and parameter identification are carried out for the nonlinear electrical model of the supercapacitor cell, which is more in line with the electrical external characteristics of the supercapacitor. The charging test of the supercapacitor system is carried out to adjust the available power of the supercapacitor system, which is more in line with the electrical external characteristics of the system-level working conditions. By setting the working conditions that conform to the supercapacitor cell and the supercapacitor system level to use the electrical external characteristics, the effective capacity estimation accuracy of the supercapacitor energy storage system is higher, thus improving the power saving of the supercapacitor energy storage system and reducing the cost of equipment per unit of electricity saving.

BRIEF DESCRIPTION OF THE DRAWINGS

In order to more clearly explain the embodiment of the invention or the technical solution in the existing technology, the following will briefly introduce the drawings that need to be used in the embodiment or the description of the existing technology. Obviously, the drawings in the following description are some embodiments of the invention, for ordinary technicians in this field, they can also obtain other drawings based on these drawings without paying creative labor.

Figure 1:
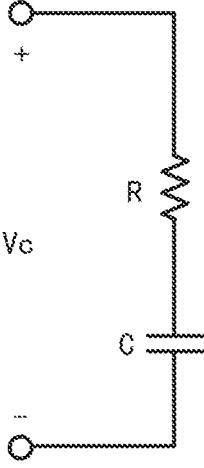

FIG. 1 is an electrical model of the single RC series equivalent circuit in the embodiment of the invention.

Figure 2:
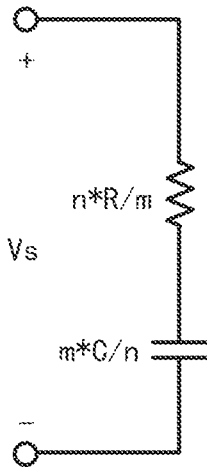

FIG. 2 is an electrical model of the system RC series equivalent circuit in the embodiment of the invention.

Figure 3:
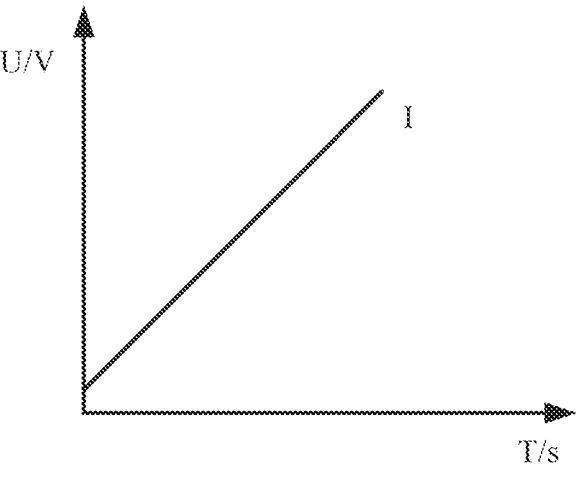

FIG. 3 is a capacitance voltage curve of the RC series equivalent model under constant current charging conditions in the embodiment of the invention.

Figure 4:
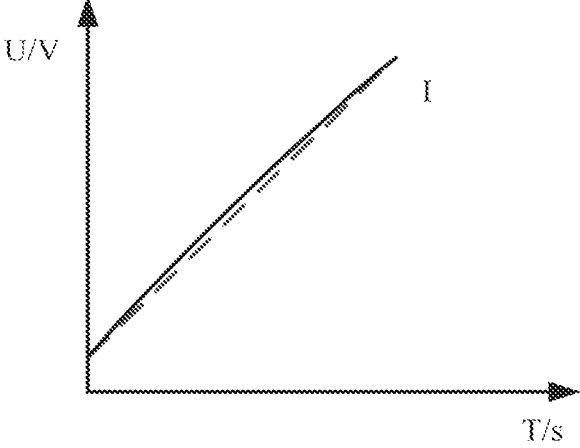

FIG. 4 is an actual capacitance voltage curve under constant current charging conditions in the embodiment of the invention.

FIG. 5 is a flow chart of a specific example of the effective capacity estimation method for supercapacitor energy storage systems in the embodiment of the invention.

FIG. 6 is a nonlinear electrical model of the supercapacitor cell in the embodiment of the invention.

Figure 7:
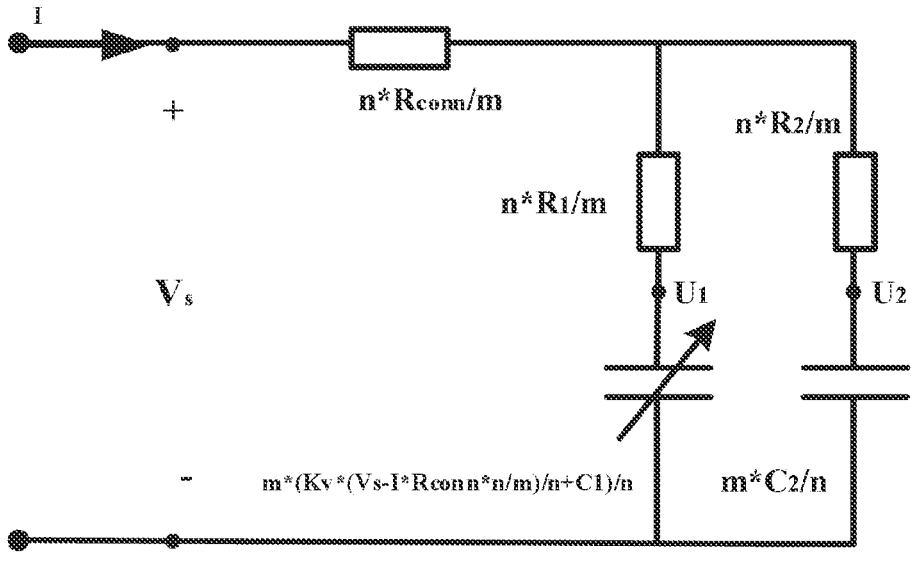

FIG. 7 is an equivalent electrical model of the supercapacitor system in the embodiment of the invention.

Figure 8:
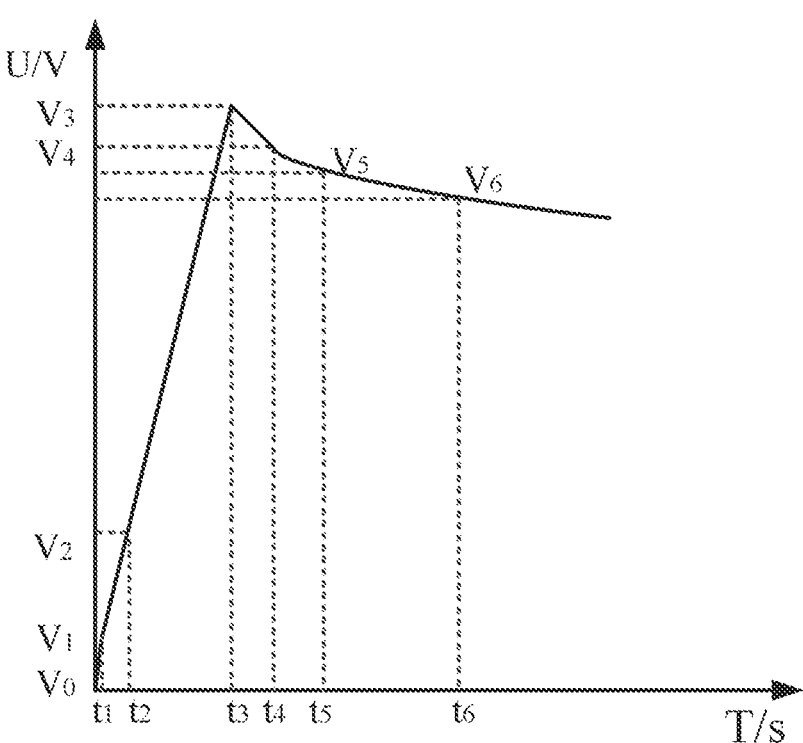

FIG. 8 is the first test data recording curve in the embodiment of the invention.

Figure 9:
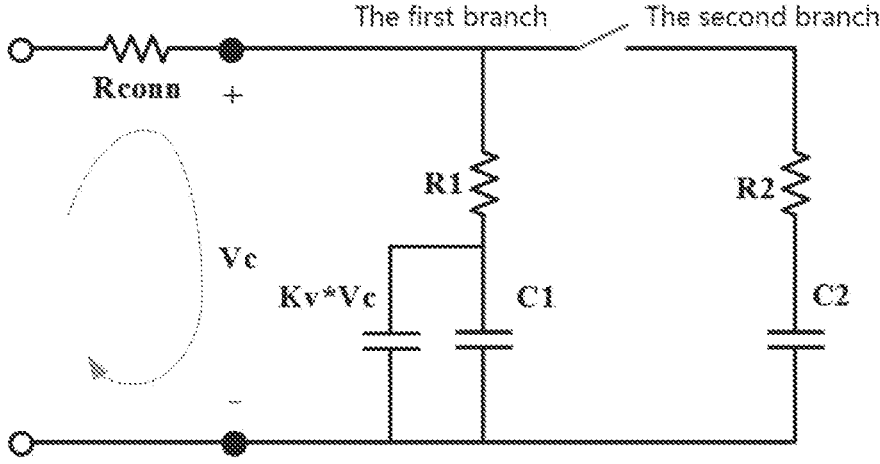

FIG. 9 is a charging diagram of a specific example of the nonlinear electrical model of the supercapacitor cell in the embodiment of the invention.

Figure 10:
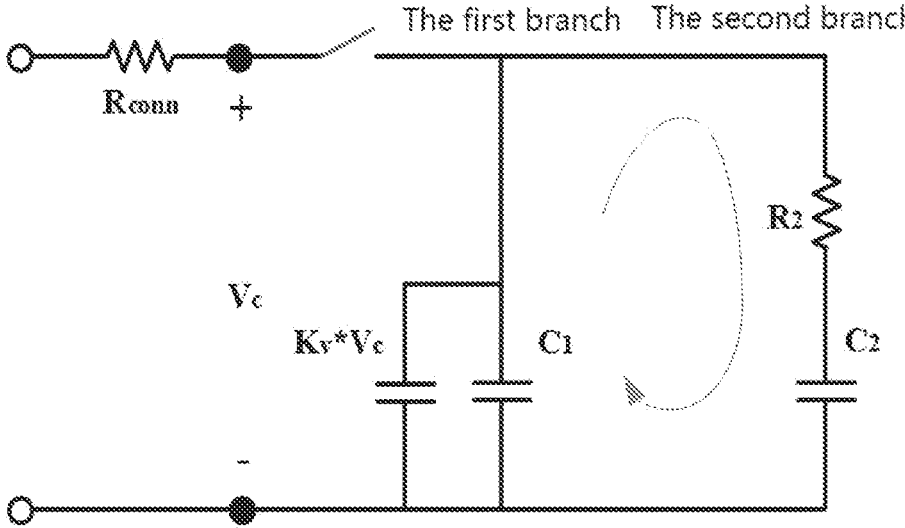

FIG. 10 is a charging diagram of another specific example of the nonlinear electrical model of the supercapacitor cell in the embodiment of the invention.

Figure 11:
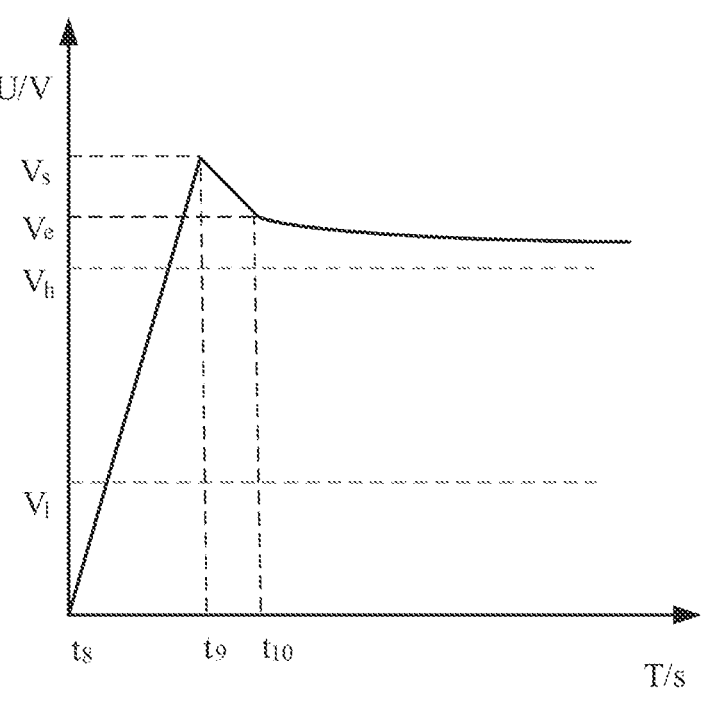
Figure 12:
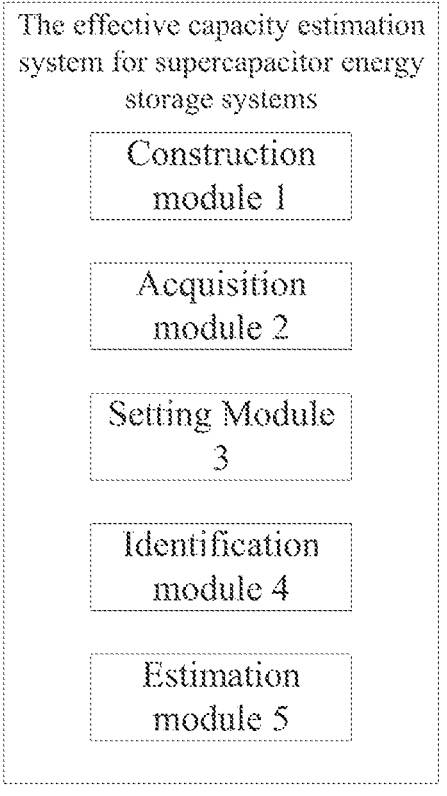

FIG. 11 is a schematic diagram of the data recording curve of the supercapacitor system in the embodiment of the invention;

FIG. 12 is a principle diagram of a specific example of the effective capacity estimation system for supercapacitor energy storage systems in the embodiment of the invention.

Figure 13:
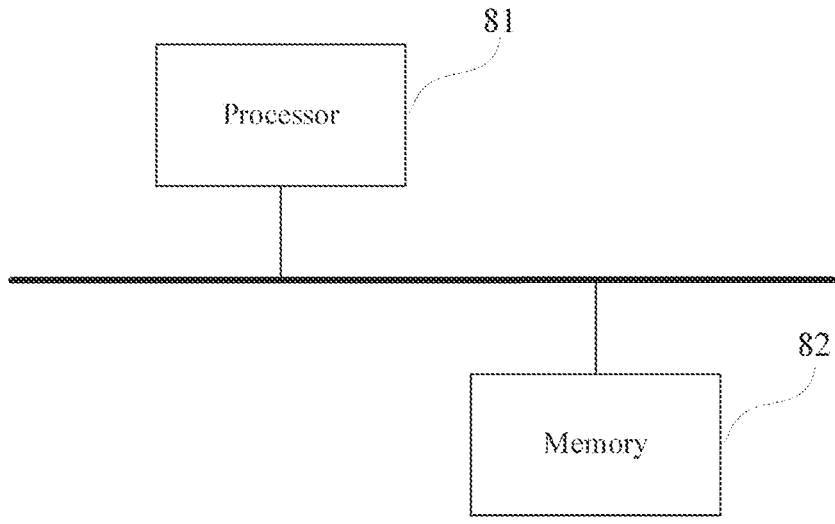

FIG. 13 is a composition diagram of a specific example of the computer device in the embodiment of the invention.

DETAILED DESCRIPTION OF THE EMBODIMENTS

The technical solution of the invention is clearly and completely described in combination with the drawings below. Obviously, the embodiment described is part of the embodiments of the invention, not all embodiments. Based on the embodiment in this invention, all other embodiments obtained by ordinary technicians in this field without making creative labor belong to the protection scope of this invention.

In the description of the invention, it should be noted that the orientation or positional relationship indicated by the terms 'center', 'upper', 'lower', 'left', 'right', 'vertical', 'horizontal', 'inner', 'outer', etc. is based on the orientation or positional relationship shown in the attached figures. It is only for the convenience of describing the invention and simplifying the description, rather than indicating or suggesting that the device or component referred to must have a specific orientation, be constructed and operated in a specific orientation, so it cannot be understood as a restriction on the invention. In addition, the terms 'first', 'second', and 'third' are only used for descriptive purposes and cannot be understood as indicating or implying relative importance.

In the description of the invention, it should be noted that, unless otherwise specified and limited, the terms 'installation', 'connection', and 'link' should be understood in a broad sense, for example, it can be fixed connection, detachable connection, or integrated connection; it can be a mechanical connection or an electrical connection; it can be directly connected or indirectly connected through the intermediate medium. It can also be the internal connection of the two components, which can be wireless or wired. For ordinary technicians in this field, the specific meaning of the above terms in this invention can be understood in detail.

In addition, the technical features involved in the different embodiments of the present invention described below can be combined as long as there is no conflict between them.

The existing typical supercapacitor energy storage system measures the internal resistance and capacitance of the cell according to the MAXWELL six-step method or the cell measurement method in the IEC62391 standard and obtains the electrical parameters of the RC series equivalent circuit. The equivalent circuit electrical model is shown in FIG. 1, where $V_c$ is the open circuit voltage of the cell.

According to the parameters of the supercapacitor cell and the series-parallel situation of the cell in the energy storage system, the RC series equivalent circuit of the supercapacitor system is obtained. The supercapacitor system is composed of cells with n serial-cells and m parallel-strings and the RC series equivalent circuit of the traditional supercapacitor energy storage system is shown in FIG. 2, where $V_S$ is the open circuit voltage of the supercapacitor system.

This equivalent method mainly considers the linear characteristics of the supercapacitor, that is, the capacitance of the supercapacitor is constant, under the constant current charging condition, the voltage of the supercapacitor and the charging time are linear, as shown in FIG. 3.

Formula (1) is often used to calculate the effective electric quantity.

$$I*t=C*V \tag{1}$$

In the formula, I is a constant charging current, t is a time of constant current charging, V is a terminal voltage of the supercapacitor system, and C is the capacitance of the supercapacitor system.

The available power is estimated as $$E = \frac{1}{2}C\left(U_h^2 - U_i^2\right) \tag{2}$$

In Formula (2), Uh and Ui are the upper and lower limits of the operating voltage of the supercapacitor, respectively.

In fact, supercapacitors have certain nonlinear characteristics, and the connection resistance in the series-parallel process of supercapacitors also needs to be considered. The constant current charging curve of the supercapacitor is shown in FIG. 4, the capacitance C changes in a wide range with the increase or decrease of the charging voltage.

Considering the actual capacitance voltage change, Formula (2) will no longer be applicable, and a new effective capacity calculation method is needed to replace the old method. therefore, the embodiment of the invention provides an effective capacity estimation method for supercapacitor energy storage systems, as shown in FIG. 5, including the following steps:

Step S1: establishing a nonlinear electrical model of a supercapacitor cell and an equivalent electrical model of a supercapacitor system.

In a specific embodiment, the effective capacity of the supercapacitor energy storage system was estimated based on the nonlinear electrical model of the supercapacitor cell shown in FIG. 6.

In the embodiment of the invention, as shown in FIG. 6, the nonlinear electrical model of the supercapacitor cell was a two-branch electrical model. The nonlinear electrical model of the supercapacitor cell included a connection resistance $R_{conn}$, the first branch, and the second branch, among them, the first branch was connected in parallel with the second branch and connected in series with the connection resistance; the first branch included the first resistor $R_1$, the first capacitor $C_1$ and the voltage-controlled capacitor $C_0$; the first capacitor $C_1$ and the voltage-controlled capacitor C0 were connected in series with the first resistor $R_1$; the second branch included the second resistor $R_2$ and the second capacitor $C_2$, and the second resistor R2 was connected in series with the second capacitor $C_2$. In the embodiment of the invention, the two-branch electrical model of the complex circuit of the supercapacitor system was equivalent according to the single electrical model, which reduced the complexity of the system electrical model.

Specifically, in FIG. 6, $V_c$ is a terminal voltage of the supercapacitor, and the voltage of the supercapacitor is measured for the supercapacitor management unit. $R_{conn}$ is the equivalent connection resistance caused by the series-parallel connection of supercapacitors, $R_1$ and $C_1$ are the resistance and capacitance of the first branch, and $R_2$ and $C_2$ are the resistance and capacitance of the second branch. K, is the coefficient of the voltage-controlled capacitor, and the capacitance $C_0$ of the voltage-controlled capacitor is calculated according to Formula (3).

$$C_0 = K_v * V_c \qquad (3)$$

According to the nonlinear electrical model of the supercapacitor cell shown in FIG. 6, the equivalent electrical model of the supercapacitor system with n serial-cells and m parallel-strings shown in FIG. 7 is derived. $V_s$ is the open circuit voltage of the system.

Step S2: obtaining the first test data by charging the supercapacitor cell.

In a specific embodiment, the time interval between the completion of traction work and the start of braking work of urban rail transit vehicles was T. The constant current I charging test was carried out on the supercapacitor cell, the cell voltage changed from 0 to the rated voltage V3, when the cell voltage reached V3, the charging was stopped, and then the charge redistribution stage of the two branches was entered. In this process, the first test data in the constant current I charging test was recorded, in FIG. 8, $t_6 - t_5 = \tau$.

Step S3: based on the first test data, setting the initial value of parameters of the nonlinear electrical model of the supercapacitor cell by a preset algorithm.

In a specific embodiment, the initial value of the nonlinear electrical model of the supercapacitor cell was set by the following steps:

Step S301: The supercapacitor cell was charged by constant current.

Step S302: When the charging time reached the first preset time, the voltage at both ends of the supercapacitor cell was measured as the first voltage.

Step S303: The initial value of the first resistor was calculated according to the first voltage and constant current charging current.

Step S304: When the supercapacitor cell was charged to the second voltage, the constant current charging time of the supercapacitor cell was recorded as the second preset time.

Step S305: According to the first preset time, the second preset time, the first voltage, the second voltage, and the constant current charging current, the initial parameters of the first capacitor were calculated.

Step S306: When the supercapacitor cell was charged to the rated voltage, the charging was completed, and the constant current charging time of the supercapacitor cell was recorded as the third preset time.

Step S307: After completing the charging, the charge redistribution stage of the two branches was entered, when the supercapacitor cell was monitored to discharge to the fourth voltage, the discharge time as the fourth preset time was recorded.

Step S308: According to the fourth preset time and the first preset time, the actual constant current charging time of the supercapacitor cell was recorded.

Step S309: According to the actual constant current charging time and constant current charging current of the supercapacitor cell, the first charge amount actually stored in the supercapacitor cell was calculated.

Step S310: According to the first branch transient capacitance integral formula, the second charge amount was calculated when the two ends of the supercapacitor cell were charged to the fourth voltage.

Step S311: according to the first charge calculation formula and the second charge calculation formula, the coefficient of the voltage-controlled capacitor was calculated.

Step S312: When the discharge of the supercapacitor cell was monitored to the fifth voltage, the discharge time was recorded as the fifth preset time.

Step S313: According to the fourth preset time, the fifth preset time, the first capacitor, the coefficient of the voltage-controlled capacitor, and the preset voltage value of the voltage-controlled capacitor, establishing an equation of the charging current of the first branch to the second branch from the perspective of the resistance voltage drop and the charge redistribution, and the initial value of the parameters of the second resistor was calculated.

Step S314: when the discharge time was monitored to reach the sixth preset time, the voltage at both ends of the supercapacitor cell was measured as the sixth voltage, and the charge amount at the sixth preset time and the initial value of the second capacitor were calculated, the time interval between the sixth preset time and the fifth preset time was the time interval between the completion of the traction work and the start of the braking work of the urban rail transit vehicle.

In the embodiment of the invention, the first preset time such as the magnitude of 20 ms can be selected according to the error evaluation, and the corresponding first voltage was $V_1$. When the supercapacitor voltage started constant current charging from 0V, due to the influence of the resistance of each branch of the supercapacitor, the voltage would have a short-term mutation. In FIG. 6, the first branch is a short-time constant branch and the second branch is a long-time constant branch. In the short-term characteristics, it can be considered that the second branch does not participate in the charging process. In the 0-$t_4$ period in FIG. 8, the schematic diagram of the charging electrical equivalent model is shown in FIG. 9. In the $t_1$ period, the voltage of the capacitor $C_1$ is considered to be 0V The initial value of $R_1$ in the model of FIG. 6 is:

$$R_1 = \frac{V_1}{I} \qquad (4)$$

Furthermore, the second voltage $V_2=V_1+i$ is taken, which is corresponding to the second preset time $t_2$. The value of i can be set according to the minimum resolution of the test equipment, when the value of i is smaller, the calculated value is closer to the real value. According to the error evaluation, the voltage magnitude of 100 mV can be selected. During the $t_1$-$t_2$ period, the supercapacitor voltage Vc value is about 0V Therefore, the voltage-controlled capacitor is neglected, and the main reason for the increase in voltage is current injection C1. The initial value of the first capacitor C1 in the model of FIG. 6 is:

$$C_1 = I * \frac{t_2 - t_1}{V_2 - V_1} \qquad (5)$$

Furthermore, $V_3$ is the rated voltage, and the constant current charging time of the supercapacitor cell is recorded as the third preset time $t_3$. The charging ends at time $t_3$, then it enters the charge redistribution stage of two branches. When the supercapacitor cell is monitored to discharge to the fourth voltage $V_4$, the fourth preset time $t_4$ is recorded. Taking $t_4=t_3+20$ ms. In the embodiment of the invention, according to the test data error evaluation, the time difference between the fourth preset time $t_4$ and the third preset time $t_3$ is 20 ms. Because of the influence of internal resistance, it can be equivalent to $t_1$-$t_4$ as the actual constant current charging time of the supercapacitor.

Therefore, the actual storage charge of the supercapacitor is:

$$Q_4 = *I(t_4 - t_1) \qquad (6)$$

The transient capacitance of the first branch of the supercapacitor is:

$$\frac{dQ}{dv} = C_1 + K_v * v \qquad (7)$$

Integrating the formula to obtain:

$$Q = C_1 * v + \frac{1}{2} K_v * v^2 \qquad (8)$$

When the supercapacitor voltage is $V_4$, $$Q_4 = C_1 * V_4 + \frac{1}{2} K_v * V_4^2 \qquad (9)$$

According to Formula (6) and Formula (9), the initial value of K, in the model of FIG. 6 is $$K_v = \frac{2}{V_4} * \frac{I/(t_4 - t_1)}{V_4} - C_1 \qquad (10)$$

Furthermore, in the $t_4$-$t_6$ stage, the charging process of the supercapacitor has been completed, and the charge redistribution stage of the two branches is entered. In this stage, part of the charges of the first branch will be transferred to the second branch one after another, and the resistance $R_1$ of the first branch is ignored because it is much smaller than $R_2$. The equivalent electrical model is shown in FIG. 10.

Taking the fifth voltage $V_5=V_4-100$ mV, which is corresponding to the fifth preset time $t_5$. In the embodiment of the invention, according to the test data error, the difference between the optional fifth voltage V5 and the fourth voltage V4 was 100 mV Since the time is very short, it is assumed that the charging current I of the first branch to the second branch remains unchanged. The charging current from the perspective of resistance voltage drop is:

$$I_c = \frac{\left(V_4 - \frac{I}{2}\right)}{R_2} \qquad (11)$$

The short-term voltage change can be considered to be linear, and the voltage of the voltage-controlled capacitor can be selected as $$V_4 - \frac{I}{2},$$

considering that the charging current is from the perspective of charge redistribution:

$$I_c = \frac{\left(C_1 + K_v * \left(V_4 - \frac{1}{2}\right)\right) * I}{t_5 - t_4} \qquad (12)$$

According to Formula (11) and Formula (12), the initial value of the parameters of $R_2$ of the model in FIG. 6 is:

$$R_2 = \frac{(V_4 - (V_5 - V_4)/2) * (t_5 - t_4)}{(C_1 + K_v * V_5) * (V_5 - V_4)} \qquad (13)$$

The sixth preset time $t_6=t_5+\tau$ is taken, and the sixth voltage of the corresponding cell is V6. Under this condition, it is considered that the charge redistribution occurs during this period. In this stage, the total charge amount is:

$$Q_{tot} = C_2 * V_6 + V_6 \left(C_1 + \frac{1}{2} K_v V_6\right) \qquad (14)$$

Among them, $Q_{tot}$ is the charge amount at the sixth preset time.

The total charge amount includes the charge amount stored by the first branch capacitor and the charge amount stored by the second branch capacitor. The initial value of the parameters of C2 of the model in FIG. 6 is:

$$C_2 = \frac{Q_{tot}}{V_6} - \left(C_1 + \frac{K_v * V_6}{2}\right) \qquad (15)$$

Step S4: using the least-square method to identify the parameters of the nonlinear electrical model of the supercapacitor cell, and obtaining the nonlinear electrical model with accurate parameters.

In a specific embodiment, after the initial value of the nonlinear electrical model parameters of the supercapacitor cell was obtained, the least-square method was used to identify the parameters and obtain the nonlinear electrical model of the accurate parameters.

Step S5: obtaining electrical parameters of the equivalent electrical model of the supercapacitor system except for the connection resistance parameters, carrying out a charging test of the supercapacitor system to obtain the connection resistance parameters, and estimating an effective capacity of the supercapacitor energy storage system based on the equivalent electrical model of the supercapacitor system after parameter identification.

In a specific embodiment, the effective capacity of the supercapacitor energy storage system was estimated by the following steps:

Step S501: The corresponding relationship between the nonlinear electrical model of the supercapacitor cell and the equivalent electrical model of the supercapacitor system was established, based on the parameter identification results of the nonlinear electrical model of the supercapacitor cell, other electrical parameters of the equivalent electrical model of the supercapacitor system except the connection resistance parameters was obtained;

Step S502: The equivalent electrical model of the supercapacitor system is charged to obtain the second test data.

Step S503: The parameter identification value of the connection resistance was calculated according to the second test data;

Step S504: The identification parameters of the equivalent electrical model of the supercapacitor system were obtained according to the other electrical parameters of the equivalent electrical model of the supercapacitor system except the connection resistance parameters and the identification parameters of the connection resistance.

Step S505: The working voltage range of the supercapacitor system was obtained, and the effective capacity of the supercapacitor energy storage system was estimated according to the estimation formula of available power.

In the embodiment of the invention, according to the parameter identification results, other electrical parameters except for the connection resistance parameters of the system model shown in FIG. 7 can be obtained. The supercapacitor system was charged, and the charging current was $I_s$; when the charging voltage reached the rated voltage $V_s$ from 0V, the charging was stopped. At this time, the voltage dropped to $V_c$. The parameter identification value of $R_{conn}$ in the model of FIG. 5 is:

$$R_{conn} = \frac{(V_s - V_e)*m}{I_s*n} \quad (16)$$

FIG. 11 is the schematic diagram of the data recording curve of the supercapacitor system. Taking $V_h$ and $V_1$ as the working voltage range of the supercapacitor system, the available power $E_1$ is:

$$E_1=\frac{1}{2}((m*(K_v*(V_h-I_s*R_{conn}*n/m)/n+C_1)/n)*(V_h-I_s* \\ (n*R_{conn}/m+n*R_1/m))^2-m*C_2/n*(V_1-I_s* \\ (n*R_{conn}/m+n*R_2/m))^2) \quad (17)$$

Formula (17) using the alternative Formula (2) as the newly available power estimation expression of the supercapacitor system.

In this embodiment, by adjusting the available power of the supercapacitor system, it is more in line with the operating conditions of the supercapacitor system and improves the regenerative energy recovery effect.

The invention provides an effective capacity estimation method for supercapacitor energy storage systems, including: establishing a nonlinear electrical model of supercapacitor cell and an equivalent electrical model of supercapacitor system; obtaining the first test data by charging the supercapacitor cell; based on the first test data, setting the initial value of parameters of the nonlinear electrical model of the supercapacitor cell by a preset algorithm; using the least-square method to identify the parameters of the nonlinear electrical model of the supercapacitor cell, and obtaining the nonlinear electrical model with accurate parameters; obtaining electrical parameters of the equivalent electrical model of the supercapacitor system except the connection resistance parameters, carrying out a charging test of the supercapacitor system to obtain the connection resistance parameters, and estimating an effective capacity of the supercapacitor energy storage system based on the equivalent electrical model of the supercapacitor system after parameter identification. The initial value setting and parameter identification are carried out for the nonlinear electrical model of the supercapacitor cell, which is more in line with the electrical external characteristics of the supercapacitor. The charging test of the supercapacitor system is carried out to adjust the available power of the supercapacitor system, which is more in line with the electrical external characteristics of the system-level working conditions. By setting the working conditions that conform to the supercapacitor cell and the supercapacitor system level to use the electrical external characteristics, the effective capacity estimation accuracy of the supercapacitor energy storage system is higher, thus improving the power saving of the supercapacitor energy storage system and reducing the cost of equipment per unit of electricity saving.

The embodiment of the invention also provides an effective capacity estimation system for supercapacitor energy storage systems, as shown in FIG. 12, including:

Construction module 1, which is used to establish the nonlinear electrical model of the supercapacitor cell and the equivalent electrical model of the supercapacitor system. The details are shown in the relevant description of step S1 in the above embodiment, which will not be repeated here.

Acquisition module 2, which is used for charging the supercapacitor cell to obtain the first test data. The details are shown in the relevant description of step S2 in the above embodiment, which will not be repeated here.

Setting Module 3, which is used for setting the initial value of the parameters of the nonlinear electrical model of the supercapacitor cell through the preset algorithm based on the first test data; The details are shown in the relevant description of step S3 in the above embodiment, which will not be repeated here.

Identification module 4, which is used to identify the parameters of the nonlinear electrical model of the supercapacitor cell by using the least-square method to obtain the nonlinear electrical model with accurate parameters. The details are shown in the relevant description of step S4 in the above embodiment, which will not be repeated here.

Estimation module 5, which is used to obtain other electrical parameters of the equivalent electrical model of the supercapacitor system except for the connection resistance parameters, carrying out the charging test of the supercapacitor system to obtain the connection resistance parameters, and estimating an effective capacity of the supercapacitor energy storage system based on the equivalent electrical model of the supercapacitor system after parameter identification. The details are shown in the relevant description of step S5 in the above embodiment, which will not be repeated here.

The embodiment of the invention provides a computer device, as shown in FIG. 13, which can include processor 81 and memory 82, where processor 81 and memory 82 can be connected by bus or other means, and bus connection is taken as an example in FIG. 13.

Processor 81 can be a central processing unit (CPU). Processor 81 can also be used for other general-purpose processors, digital signal processor (DSP), application specific integrated circuit (ASIC), field-programmable gate array (FPGA) or other programmable logic devices, discrete gates or transistor logic devices, discrete hardware components and other chips, or a combination of the above types of chips.

As a non-transient computer readable storage medium, memory 82 can be used to store non-transient software programs, non-transient computer executable programs, and modules, such as corresponding program instructions/modules in the embodiment of the invention. Processor 81 performs various functional applications and data processing of the processor by running non-transient software programs, instructions, and modules stored in memory 82, that is, the effective capacity estimation method for the supercapacitor energy storage systems in the above embodiment.

Memory 82 can include a storage program area and a storage data area, where the storage program area can store the operating system and at least one application required for the function; the storage data area can store data created by processor 81, etc. In addition, memory 82 can include high-speed random access memory and non-transient memory, such as at least one disk memory device, a flash memory device, or other non-transient solid-state memory devices. In some embodiments, memory 82 optionally includes memory set remotely relative to processor 81, which can be connected to processor 81 over a network. Examples of the above networks include but are not limited to the Internet, enterprise intranets, enterprise intranets, mobile communication networks, and their combinations.

One or more modules are stored in memory 82. When executed by processor 81, the effective capacity estimation method for supercapacitor energy storage systems is performed as shown in FIG. 5-FIG. 11.

The specific details of the above computer devices can be understood by referring to the relevant descriptions and effects in the embodiment shown in FIG. 5-FIG. 11.

The technical personnel in this field can understand that all or a part of the process of implementing the above embodiment can be completed by the computer program to instruct the relevant hardware. The program can be stored in a computer-readable storage medium. When the program is executed, it can include the process of the implementation of the above methods. Among them, the storage medium can be a magnetic disk, optical disk, Read-Only Memory (ROM), Random Access Memory (RAM), Flash Memory, Hard Disk Drive (HDD) or Solid-State Drive (SSD), etc.; the storage media can also include a combination of the above types of memory.

Obviously, the above embodiment is only an example for a clear explanation, which is not used for limiting the embodiments. For ordinary technical personnel in their field, other different forms of changes or variations can be made based on the above description, there is no need and no way to exhaust all the embodiments. Therefore, the obvious changes or variations derived are still within the protection scope of the invention.

What is claimed is:

1. An effective capacity estimation method for supercapacitor energy storage systems, comprising:

establishing a nonlinear electrical model of a supercapacitor cell and an equivalent electrical model of a supercapacitor system;

obtaining first test data by charging the supercapacitor cell;

based on the first test data, setting an initial value of parameters of the nonlinear electrical model of the supercapacitor cell by a preset algorithm;

using a least-square method to identify the parameters of the nonlinear electrical model of the supercapacitor cell, and obtaining the nonlinear electrical model with accurate parameters; and obtaining electrical parameters of the equivalent electrical model of the supercapacitor system except for connection resistance parameters, carrying out a charging test of the supercapacitor system to obtain the connection resistance parameters, and estimating an effective capacity of the supercapacitor energy storage system based on the equivalent electrical model of the supercapacitor system after a parameter identification.

2. The effective capacity estimation method for the supercapacitor energy storage systems according to claim 1, wherein the nonlinear electrical model of the supercapacitor cell is a two-branch electrical model, the nonlinear electrical model of the supercapacitor cell, comprising a connection resistance, a first branch and a second branch, wherein the first branch is connected in parallel with the second branch and connected in series with the connection resistance;

the first branch comprises a first resistor, a first capacitor, and a voltage-controlled capacitor, the first capacitor is connected in series with the first resistor after being connected in parallel with the voltage-controlled capacitor; and the second branch comprises a second resistor and a second capacitor, and the second resistor is connected in series with the second capacitor.

3. The effective capacity estimation method for the supercapacitor energy storage systems according to claim 2, wherein based on the first test data, setting the initial value of the parameters of the nonlinear electrical model of the supercapacitor cell by a preset algorithm, comprising:

a constant current charging of supercapacitor cell;

when a charging time reaches a first preset time, measuring a voltage at both ends of the supercapacitor cell as a first voltage;

calculating an initial value of a first resistance parameter according to the first voltage and a constant current charging current;

when the supercapacitor cell is monitored to be charged to a second voltage, recording a constant current charging time of the supercapacitor cell as a second preset time; and according to the first preset time, the second preset time, the first voltage, the second voltage, and the constant current charging current, calculating initial parameters of the fist capacitor.

4. The effective capacity estimation method for the supercapacitor energy storage systems according to claim 3, wherein the operation of, based on the first test data, setting the initial value of the parameters of the nonlinear electrical model of the supercapacitor cell by the preset algorithm further comprises:

when the supercapacitor cell is charged to a rated voltage, completing the charging, and recording the constant current charging time of the supercapacitor cell as a third preset time;

after completing the charging, entering a charge redistribution stage of the first and second branches, when the supercapacitor cell is monitored to discharge to a fourth voltage, recording a discharge time as a fourth preset time;

according to the fourth preset time and the first preset time, recording an actual constant current charging time of the supercapacitor cell;

according to the actual constant current charging time and constant current charging current of the supercapacitor cell, calculating a first charge amount actually stored in the supercapacitor cell;

according to a first branch transient capacitance integral formula, calculating a second charge amount when the two ends of the supercapacitor cell are charged to the fourth voltage; and according to a first charge calculation formula and a second charge calculation formula, calculating a coefficient of the voltage-controlled capacitor.

5. The effective capacity estimation method for the supercapacitor energy storage systems according to claim 4, wherein the operation of, based on the first test data, setting the initial value of the parameters of the nonlinear electrical model of the supercapacitor cell by the preset algorithm further comprises:

when the supercapacitor cell is monitored to discharge to a fifth voltage, recording the discharge time as a fifth preset time;

according to the fourth preset time, the fifth preset time, the first capacitor, the coefficient of the voltage-controlled capacitor, and a preset voltage value of the voltage-controlled capacitor, establishing an equation of the charging current of the first branch to the second branch from a perspective of a resistance voltage drop and a charge redistribution, and calculating the initial value of the parameters of the second resistor; and when the discharge time is monitored to reach a sixth preset time, measuring the voltage at both ends of the supercapacitor cell as a sixth voltage, and calculating a charge amount at the sixth preset time and the initial value of the second capacitor, a time interval between the sixth preset time and the fifth preset time being a time interval between a completion of a traction work and a start of a braking work of an urban rail transit vehicle.

6. The effective capacity estimation method for the supercapacitor energy storage systems according to claim 2, wherein the operations of obtaining electrical parameters of the equivalent electrical model of the supercapacitor system except for the connection resistance parameters, carrying out a charging test of the supercapacitor system to obtain the connection resistance parameters, and estimating an effective capacity of the supercapacitor energy storage system based on the equivalent electrical model of the supercapacitor system after a parameter identification comprises:

establishing a corresponding relationship between the nonlinear electrical model of the supercapacitor cell and the equivalent electrical model of the supercapacitor system, based on parameter identification results of the nonlinear electrical model of the supercapacitor cell, obtaining other electrical parameters of the equivalent electrical model of the supercapacitor system except the connection resistance parameters;

charging the supercapacitor system to obtain second test data;

calculating a parameter identification value of the connection resistance according to the second test data;

obtaining identification parameters of the equivalent electrical model of the supercapacitor system according to the other electrical parameters of the equivalent electrical model of the supercapacitor system except for the connection resistance parameters and identification parameters of the connection resistance; and obtaining a working voltage range of the supercapacitor system, and estimating the effective capacity of the supercapacitor energy storage system according to an estimation formula of an available power.

7. The effective capacity estimation method for the supercapacitor energy storage systems according to claim 1, wherein the effective capacity estimation method further comprises the operation of deriving the equivalent electrical model of the supercapacitor system with plurality of serial-cells per string and a plurality of parallel-strings based on the nonlinear electrical model of the supercapacitor cell.

8. A non-transitory computer-readable storage medium, wherein the non-transitory computer-readable storage medium stores computer instructions configured to enable a computer to perform the effective capacity estimation method for the supercapacitor energy storage systems according to claim 1.

9. The non-transitory computer-readable storage medium according to claim 8, wherein in the effective capacity estimation method, the nonlinear electrical model of the supercapacitor cell is a two-branch electrical model, the nonlinear electrical model of the supercapacitor cell, comprising a connection resistance, a first branch and a second branch, wherein the first branch is connected in parallel with the second branch and connected in series with the connection resistance;

the first branch comprises a first resistor, a first capacitor, and a voltage-controlled capacitor, the first capacitor is connected in series with the first resistor after being connected in parallel with the voltage-controlled capacitor; and the second branch comprises a second resistor and a second capacitor, and the second resistor is connected in series with the second capacitor.

10. The non-transitory computer-readable storage medium according to claim 9, wherein the effective capacity estimation method, based on the first test data, setting the initial value of the parameters of the nonlinear electrical model of the supercapacitor cell by a preset algorithm, comprising:

a constant current charging of supercapacitor cell;

when a charging time reaches a first preset time, measuring a voltage at both ends of the supercapacitor cell as a first voltage;

calculating an initial value of a first resistance parameter according to the first voltage and a constant current charging current;

when the supercapacitor cell is monitored to be charged to a second voltage, recording a constant current charging time of the supercapacitor cell as a second preset time; and according to the first preset time, the second preset time, the first voltage, the second voltage, and the constant current charging current, calculating initial parameters of the first capacitor.

11. The non-transitory computer-readable storage medium according to claim 10, wherein in the effective capacity estimation method, the operation of, based on the first test data, setting the initial value of the parameters of the nonlinear electrical model of the supercapacitor cell by the preset algorithm further comprises:

when the supercapacitor cell is charged to a rated voltage, completing the charging, and recording the constant current charging time of the supercapacitor cell as a third preset time;

after completing the charging, entering a charge redistribution stage of the first and second branches, when the supercapacitor cell is monitored to discharge to a fourth voltage, recording a discharge time as a fourth preset time;

according to the fourth preset time and the first preset time, recording an actual constant current charging time of the supercapacitor cell;

according to the actual constant current charging time and constant current charging current of the supercapacitor cell, calculating a first charge amount actually stored in the supercapacitor cell;

according to a first branch transient capacitance integral formula, calculating a second charge amount when the two ends of the supercapacitor cell are charged to the fourth voltage; and according to a first charge calculation formula and a second charge calculation formula, calculating a coefficient of the voltage-controlled capacitor.

12. The non-transitory computer-readable storage medium according to claim 11, wherein in the effective capacity estimation method, the operation of, based on the first test data, setting the initial value of the parameters of the nonlinear electrical model of the supercapacitor cell by the preset algorithm further comprises:

when the supercapacitor cell is monitored to discharge to a fifth voltage, recording the discharge time as a fifth preset time;

according to the fourth preset time, the fifth preset time, the first capacitor, the coefficient of the voltage-controlled capacitor, and a preset voltage value of the voltage-controlled capacitor, establishing an equation of the charging current of the first branch to the second branch from a perspective of a resistance voltage drop and a charge redistribution, and calculating the initial value of the parameters of the second resistor; and when the discharge time is monitored to reach a sixth preset time, measuring the voltage at both ends of the supercapacitor cell as a sixth voltage, and calculating a charge amount at the sixth preset time and the initial value of the second capacitor, a time interval between the sixth preset time and the fifth preset time being a time interval between a completion of a traction work and a start of a braking work of an urban rail transit vehicle.

13. The non-transitory computer-readable storage medium according to claim 9, wherein in the effective capacity estimation method, the operations of obtaining electrical parameters of the equivalent electrical model of the supercapacitor system except for the connection resistance parameters, carrying out a charging test of the supercapacitor system to obtain the connection resistance parameters, and estimating an effective capacity of the supercapacitor energy storage system based on the equivalent electrical model of the supercapacitor system after a parameter identification comprises:

establishing a corresponding relationship between the nonlinear electrical model of the supercapacitor cell and the equivalent electrical model of the supercapacitor system, based on parameter identification results of the nonlinear electrical model of the supercapacitor cell, obtaining other electrical parameters of the equivalent electrical model of the supercapacitor system except the connection resistance parameters;

charging the supercapacitor system to obtain second test data;

calculating a parameter identification value of the connection resistance according to the second test data;

obtaining identification parameters of the equivalent electrical model of the supercapacitor system according to the other electrical parameters of the equivalent electrical model of the supercapacitor system except for the connection resistance parameters and identification parameters of the connection resistance; and obtaining a working voltage range of the supercapacitor system, and estimating the effective capacity of the supercapacitor energy storage system according to an estimation formula of an available power.

14. The non-transitory computer-readable storage medium according to claim 8, wherein in the effective capacity estimation method, the effective capacity estimation method further comprises the operations of deriving the equivalent electrical model of the supercapacitor system with plurality of serial-cells per string and a plurality of parallel-strings based on the nonlinear electrical model of the supercapacitor cell.

15. A computer device, comprising a memory and a processor, the memory and the processor communicate and connect, the memory stores computer instructions, and the processor executes the computer instructions to perform the effective capacity estimation method for the supercapacitor energy storage systems according to claim 1.

16. The computer device according to claim 15, wherein in the effective capacity estimation method, the nonlinear electrical model of the supercapacitor cell is a two-branch electrical model, the nonlinear electrical model of the supercapacitor cell, comprising a connection resistance, a first branch and a second branch, wherein the first branch is connected in parallel with the second branch and connected in series with the connection resistance;

the first branch comprises a first resistor, a first capacitor, and a voltage-controlled capacitor, the first capacitor is connected in series with the first resistor after being connected in parallel with the voltage-controlled capacitor; and the second branch comprises a second resistor and a second capacitor, and the second resistor is connected in series with the second capacitor.

17. The computer device according to claim 16, wherein in the effective capacity estimation method, based on the first test data, setting the initial value of the parameters of the nonlinear electrical model of the supercapacitor cell by a preset algorithm, comprising:

a constant current charging of supercapacitor cell;

when a charging time reaches a first preset time, measuring a voltage at both ends of the supercapacitor cell as a first voltage;

calculating an initial value of a first resistance parameter according to the first voltage and a constant current charging current;

when the supercapacitor cell is monitored to be charged to a second voltage, recording a constant current charging time of the supercapacitor cell as a second preset time; and according to the first preset time, the second preset time, the first voltage, the second voltage, and the constant current charging current, calculating initial parameters of the first capacitor.

18. The computer device according to claim 17, wherein in the effective capacity estimation method, the operations of, based on the first test data, setting the initial value of the parameters of the nonlinear electrical model of the supercapacitor cell by the preset algorithm further comprises:

when the supercapacitor cell is charged to a rated voltage, completing the charging, and recording the constant current charging time of the supercapacitor cell as a third preset time;

after completing the charging, entering a charge redistribution stage of the first and second branches, when the supercapacitor cell is monitored to discharge to a fourth voltage, recording a discharge time as a fourth preset time;

according to the fourth preset time and the first preset time, recording an actual constant current charging time of the supercapacitor cell;

according to the actual constant current charging time and constant current charging current of the supercapacitor cell, calculating a first charge amount actually stored in the supercapacitor cell;

according to a first branch transient capacitance integral formula, calculating a second charge amount when the two ends of the supercapacitor cell are charged to the fourth voltage; and according to a first charge calculation formula and a second charge calculation formula, calculating a coefficient of the voltage-controlled capacitor.

19. The computer device according to claim 18, wherein in the effective capacity estimation method, the operations of, based on the first test data, setting the initial value of the parameters of the nonlinear electrical model of the supercapacitor cell by the preset algorithm further comprises:

when the supercapacitor cell is monitored to discharge to a fifth voltage, recording the discharge time as a fifth preset time;

according to the fourth preset time, the fifth preset time, the first capacitor, the coefficient of the voltage-controlled capacitor, and a preset voltage value of the voltage-controlled capacitor, establishing an equation of the charging current of the first branch to the second branch from a perspective of a resistance voltage drop and a charge redistribution, and calculating the initial value of the parameters of the second resistor; and when the discharge time is monitored to reach a sixth preset time, measuring the voltage at both ends of the supercapacitor cell as a sixth voltage, and calculating a charge amount at the sixth preset time and the initial value of the second capacitor, a time interval between the sixth preset time and the fifth preset time being a time interval between a completion of a traction work and a start of a braking work of an urban rail transit vehicle.

20. An effective capacity estimation system for supercapacitor energy storage systems, comprising:

a construction module configured to establish a nonlinear electrical model of a supercapacitor cell and an equivalent electrical model of a supercapacitor system;

an acquisition module configured to charge the supercapacitor cell to obtain first test data;

a setting module configured to set an initial value of parameters of the nonlinear electrical model of the supercapacitor cell through a preset algorithm based on the first test data;

an identification module configured to identify the parameters of the nonlinear electrical model of the supercapacitor cell by using a least-square method to obtain the nonlinear electrical model with accurate parameters; and an estimation module configured to obtain other electrical parameters of the equivalent electrical model of the supercapacitor system except for connection resistance parameters, carry out a charging test of the supercapacitor system to obtain the connection resistance parameters, and estimate an effective capacity of the supercapacitor energy storage system based on the equivalent electrical model of the supercapacitor system after a parameter identification.

* * * * *